United States Patent
Yoshida (10) Patent No.: US 8,397,845 B2
(45) Date of Patent: Mar. 19, 2013

(54) DRIVE APPARATUS FOR VEHICLE

(75) Inventor: Tadafumi Yoshida, Nisshin (JP)

(73) Assignee: Toyota Jidosha Kabushiki Kaisha, Aichi-ken (JP)

( * ) Notice: Subject to any disclaimer, the term of this patent is extended or adjusted under 35 U.S.C. 154(b) by 852 days.

(21) Appl. No.: 12/376,538

(22) PCT Filed: Sep. 7, 2007

(86) PCT No.: PCT/JP2007/068000
§ 371 (c)(1),
(2), (4) Date: Feb. 5, 2009

(87) PCT Pub. No.: WO2008/032837
PCT Pub. Date: Mar. 20, 2008

(65) Prior Publication Data
US 2010/0175933 A1   Jul. 15, 2010

(30) Foreign Application Priority Data

Sep. 13, 2006 (JP) .................................. 2006-247984

(51) Int. Cl.
*B60K 6/26* (2007.10)

(52) U.S. Cl. .................................... 180/65.1; 180/65.22

(58) Field of Classification Search .................. 180/65.1, 180/65.21, 65.22; 903/904, 906, 909, 915, 903/916, 951, 952
See application file for complete search history.

(56) References Cited

U.S. PATENT DOCUMENTS

| 6,917,179 | B2 | 7/2005 | Komatsu |
| 7,210,304 | B2* | 5/2007 | Nagashima et al. ......... 62/259.2 |
| 2003/0066638 | A1* | 4/2003 | Qu et al. ...................... 165/186 |
| 2004/0226761 | A1 | 11/2004 | Takenaka et al. |
| 2005/0162023 | A1* | 7/2005 | Habu ............................ 307/151 |
| 2005/0211490 | A1 | 9/2005 | Shimizu et al. |

FOREIGN PATENT DOCUMENTS

| JP | 2002-217040 A |  | 8/2002 |
| JP | 2003-134606 A |  | 5/2003 |
| JP | 2003-244801 A |  | 8/2003 |
| JP | 2004-284447 A |  | 10/2004 |
| JP | 2004-343845 A |  | 12/2004 |
| JP | 2005-73392 A |  | 3/2005 |
| JP | 2005-117790 A |  | 4/2005 |
| JP | 2005117790 A | * | 4/2005 |
| JP | 2005-150517 A |  | 6/2005 |
| JP | 2005-253167 A |  | 9/2005 |

* cited by examiner

Primary Examiner — J. Alen Shriver, II
Assistant Examiner — Bryan Evans
(74) Attorney, Agent, or Firm — Sughrue Mion, PLLC (57) ABSTRACT

In a drive apparatus having an integrated structure where a rotating electric machine and an inverter and a voltage converter for driving the rotating electric machine are integrally stored in a case, lubricant oil carried up by the rotation of the motor-generator flows into a storage chamber for a reactor from an opening. The lubricant oil flown from the opening is stored inside the storage chamber with the use of a dividing wall provided between a portion where the motor-generator is stored and the storage chamber, whereby at least part of reactor is immersed in the lubricant oil. Thus, the performance of cooling the reactor is ensured.

6 Claims, 10 Drawing Sheets

DRIVE APPARATUS FOR VEHICLE

TECHNICAL FIELD

The present invention relates to a drive apparatus for a vehicle. More specifically, the present invention relates to a drive apparatus for a vehicle, which includes a reactor as a component.

BACKGROUND ART

As one type of a drive apparatus for a vehicle, there is a known configuration of a drive apparatus for a hybrid vehicle having a motor as a motive power source for the vehicle, in which an output voltage of a battery is boosted by a boost converter and the boosted voltage is used for driving the motor. For example, Japanese Patent Laying-Open No. 2003-134606 (hereinafter referred to as Patent Document 1) discloses a drive apparatus for a hybrid vehicle having a boost converter including a reactor as a component.

Generally, a reactor is configured by a core formed by a magnetic body and a coil wound around the core to ensure inductance. In such a configuration, the core generates heat in accordance with the electromagnetic energy conversion in the reactor, and the coil generates heat by Joule heat of the passing current. It is concerned that the voltage converting efficiency of the boost converter may be reduced by an increase in the temperature of the reactor due to such heat generation. Accordingly, a reactor heat dissipation mechanism is required.

As one example, Japanese Patent Laying-Open No. 2002-217040 (hereinafter referred to as Patent Document 2) discloses a configuration where a heat dissipation fin formed by a heat transfer plate is provided to the outer surface of a core (iron core) in a stationary induction electric device including a reactor.

Reduction of vehicle-installed components in size is a common problem to be solved for vehicles of every type. As to a hybrid vehicle, Japanese Patent Laying-Open No. 2004-343845 (hereinafter Patent Document 3) discloses a technique of reducing a drive apparatus in size by storing and integrating an inverter and a motor in one case.

However, in the heat dissipation mechanism for the reactor (stationary induction electric device) disclosed by Patent Document 2, the heat transfer plate for dissipating heat having the fin is additionally provided to the outer surface of the core. Therefore, the reactor becomes great in size. Accordingly, there is a problem in applying it to a boost converter as a component of a drive apparatus for a vehicle, of which adaptability to vehicle installation is weighed particularly heavily.

As to the configuration of integrating the motor and the electric circuitry group (inverter) for driving the motor disclosed by Patent Document 3, the existence of a boost converter is not particularly discussed. That is, Patent Document 3 is not aware of the problem of how to achieve both the efficient arrangement of a reactor and the ensured cooling performance, in such an integrated configuration.

DISCLOSURE OF THE INVENTION

The present invention has been made to solve the aforementioned problems, and an object thereof is to ensure the capacity of cooling a reactor, in a drive apparatus for a vehicle in which a rotating electric machine and a group of electric circuitry (a converter, an inverter or the like) for driving the rotating electric machine are integrated.

A drive apparatus for a vehicle according to the present invention includes a rotating electric machine, a power control unit, and a case. The power control unit is configured to control the rotating electric machine, and the case stores the rotating electric machine and the power control unit. The power control unit includes an inverter driving the rotating electric machine, and a voltage converter for boosting a supply voltage and providing the boosted voltage to the inverter. The voltage converter is configured to include a reactor. In particular, the case is configured to include a storage chamber storing the reactor. The storage chamber is provided in a shape such that a heat transfer medium carried up by rotation of the rotating electric machine flows into the storage chamber from an opening and at least part of the reactor is immersed in the heat transfer medium flown into the storage chamber.

According to the drive apparatus for the vehicle described above, the reactor in the storage chamber can be immersed in the refrigerant supplied according to the rotation of the rotating electric machine. Therefore, without additionally providing a refrigerant (heat transfer medium) supplying mechanism, a configuration of cooling the reactor can be implemented. Furthermore, when compared with a configuration where the lubricant oil is just flown over the reactor, the capacity of cooling the reactor can be improved.

Preferably, the storage chamber is provided with a hole discharging the heat transfer medium toward the rotating electric machine.

With such a configuration, the heat transfer medium in the storage chamber is provided with fluidity and, therefore, the cooling capacity can be improved.

Further preferably, the reactor includes a core (having a heat dissipation fin formed at least at a portion thereof) and a coil wound around the core. The storage chamber is provided in a shape such that the coil substantially in its entirety and part of the core are immersed in the heat transfer medium flown into the storage chamber. The reactor is designed such that heat generated by the coil becomes greater than heat generated by the core. For example, by the design of the material and cross-sectional area of the core, and the material (unit length resistance) and number of turns of the coil, such a heat generation characteristic can be realized.

With such a configuration, it becomes possible to ensure a wide opening through which the heat transfer medium is introduced and to sufficiently cool the portion that greatly generates heat, thereby ensuring the capacity of cooling the reactor.

Still further preferably, the heat transfer medium is lubricant oil that lubricates and cools the rotating electric machine. The lubricant oil is circulated in a space enclosed by the case, and makes contact with the case at least at part of a route along which the lubricant oil is circulated.

Thus, using the lubricant oil of the rotating electric machine as the refrigerant, that is, instead of additionally using a refrigerant (such as cooling water, for example) for cooling the reactor core, an increase in the volume of the drive apparatus can be avoided and the capacity of cooling the reactor can be ensured. Furthermore, since an increase in the temperature of the heat transfer medium is suppressed by heat exchange with the case having great heat capacity, the capacity of cooling the reactor can be ensured.

With the drive apparatus for the vehicle according to the present invention, in the structure in which the rotating electric machine and the group of electric circuitry (the converter, the inverter or the like) for driving the rotating electric machine are integrated, the performance of cooling the reactor can be ensured.

BEST MODES FOR CARRYING OUT THE INVENTION

In the following, an embodiment of the present invention will be described in detail referring to the drawings. In the drawings, an identical reference character is allotted to identical or corresponding parts, and description thereof will not be repeated.

As will be apparent from the following description, the present invention is directed to the structure of a reactor installed in a drive apparatus for a vehicle, and a cooling system configuration therefor. In the present embodiment, as a representative of a drive apparatus for a vehicle that includes a reactor as a component, description will be firstly given as to a preferable configuration of a drive apparatus for a hybrid vehicle that has a motor, which is a "rotating electric machine", and an internal combustion engine (engine) as sources of motive power for the vehicle. The drive apparatus for a hybrid vehicle described in the following has a configuration suitable for reduction in size, in which a motor (hereinafter also referred to as a motor-generator) and an electric circuitry system, including an inverter and a converter having a reactor as its component, for driving the motor-generator, are stored and integrated in the same case.

It is to be noted that, application of the present invention is not limited to the hybrid vehicle equipped with a drive apparatus described in the following. It is applicable to any hybrid or electric vehicle or the like so long as it has a vehicle drive apparatus that includes a reactor as a component.

(Description of Components of Vehicle)

Figure 1:
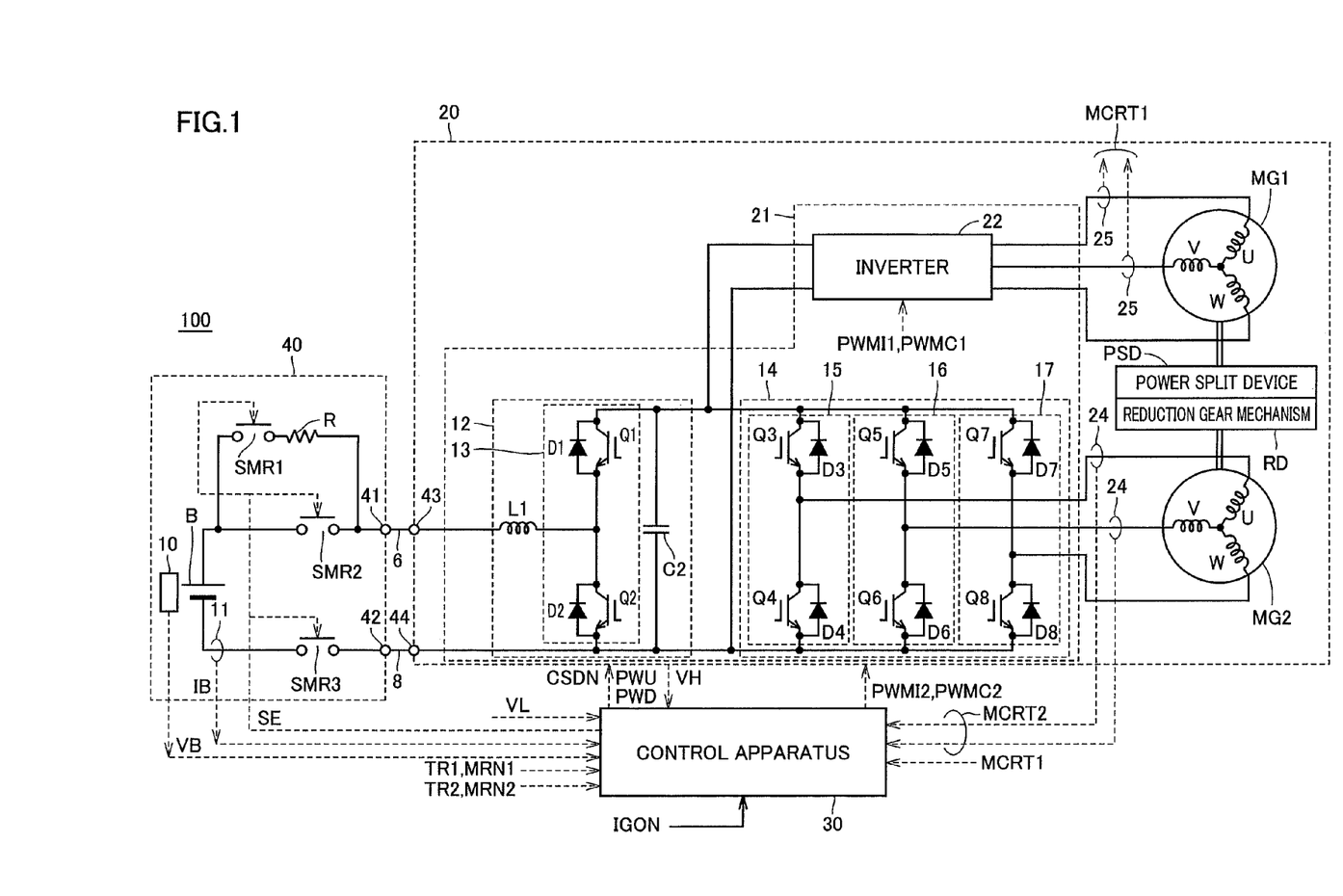
FIG. 1 is a circuit diagram showing a configuration related to motor-generator control of a hybrid vehicle according to an embodiment of the present invention.

FIG. 1 is a circuit diagram showing a configuration related to motor-generator control of a hybrid vehicle 100 according to the embodiment of the present invention.

Referring to FIG. 1, vehicle 100 includes a drive apparatus 20, a control apparatus 30, a battery unit 40, and not-shown engine and wheels.

Drive apparatus 20 includes motor-generators MG1, MG2, power split device PSD, a reduction gear mechanism RD, and a power control unit 21 that controls motor-generators MG1, MG2.

Power split device PSD is basically a mechanism coupled to the engine and motor-generators MG1, MG2 to distribute motive power among them. For example, a planetary gear mechanism having three rotation shafts of a sun gear, a planetary carrier, and a ring gear can be used as the power split device.

The two rotation shafts of power split device PSD are respectively connected to the rotation shafts of the engine and motor-generator MG1, and the other rotation shaft is connected to reduction gear mechanism RD. By reduction gear mechanism RD integrated with power split device PSD, the rotation of motor-generator MG2 is reduced and transmitted to power split device PSD.

The rotation shaft of the reduction gear mechanism is coupled to the wheels via a not-shown reduction gear or differential gear. It is to be noted that the reduction gear mechanism is not essential, and the rotation of motor-generator MG2 may be transmitted to power split device PSD without being reduced.

Battery unit 40 is provided with terminals 41, 42. Drive apparatus 20 is provided with terminals 43, 44. Vehicle 100 further includes a power cable 6 connecting terminal 41 and terminal 43, and a power cable 8 connecting terminal 42 and terminal 44.

Battery unit 40 includes a battery B, a system main relay SMR3 connected between the negative electrode of battery B and terminal 42, a system main relay SMR2 connected between the positive electrode of battery B and terminal 41, and a system main relay SMR1 and a limiting resistor R serially connected between the positive electrode of battery B and terminal 41. System main relays SMR1-SMR3 are controlled to become conductive and non-conductive in response to a control signal SE provided by control apparatus 30.

Battery unit 40 further includes a voltage sensor 10 measuring a voltage VB between the terminals of battery B, and a current sensor 11 sensing a current B3 passing through battery B.

As battery B, a secondary battery such as nickel-hydride or lithium ion battery, a fuel battery or the like can be used. As a power storage apparatus instead of battery B, a capacitor of a large capacity such as an electric double layer capacitor can be used.

Power control unit 21 includes inverters 22, 14 respectively provided corresponding to motor-generators MG1, MG2, and a boost converter 12 provided as shared by inverters 22, 14.

Boost converter 12 boosts the voltage between terminals 43, 44. Inverter 14 converts the DC (Direct Current) voltage provided from boost converter 12 into three-phase AC (Alternating Current), and outputs the converted voltage to motor-generator MG2.

Boost converter 12 includes: a reactor L1 having its one end connected to terminal 43; IGBT elements Q1, Q2 connected in series between output terminals of boost converter 12 outputting boosted voltage VH; diodes D1, D2 connected respectively in parallel with IGBT elements Q1, Q2; and a smoothing capacitor C2. Smoothing capacitor C2 smoothes the voltage boosted by boost converter 12.

Reactor L1 has its other end connected to the emitter of IGBT element Q1 and the collector of IGBT element Q2. Diode D1 has its cathode connected to the collector of IGBT element Q1, and has its anode connected to the emitter of IGBT element Q1. Diode D2 has its cathode connected to the collector of IGBT element Q2, and has its anode connected to the emitter of IGBT element Q2.

Inverter 14 converts the DC voltage output from boost converter 12 into three-phase AC and outputs the converted voltage to motor-generator MG2 driving the wheels. Inverter 14 also returns the power generated by motor-generator MG2 in accordance with regenerative braking to boost converter 12. Here, boost converter 12 is controlled by control apparatus 30 so as to operate as a step-down circuit.

Inverter 14 includes a U-phase arm 15, a V-phase arm 16, and a W-phase arm 17. U-phase arm 15, V-phase arm 16, and W-phase arm 17 are connected in parallel between the output lines of boost converter 12.

U-phase arm 15 includes IGBT elements Q3, Q4 connected in series, and diodes D3, D4 connected respectively parallel with IGBT elements Q3, Q4. Diode D3 has its cathode connected to the collector of IGBT element Q3, and has its anode connected to the emitter of IGBT element Q3. Diode D4 has its cathode connected to the collector of IGBT element Q4, and has its anode connected to the emitter of IGBT element Q4.

V-phase arm 16 includes IGBT elements Q5, Q6 connected in series, and diodes D5, D6 connected respectively in parallel with IGBT elements Q5, Q6. Diode D5 has its cathode connected to the collector of IGBT element Q5, and has its anode connected to the emitter of IGBT element Q5. Diode D6 has its cathode connected to the collector of IGBT element Q6, and has its anode connected to the emitter of IGBT element Q6.

W-phase arm 17 includes IGBT elements Q7, Q8 connected in series, and diodes D7, D8 connected respectively in parallel with IGBT elements Q7, Q8. Diode D7 has its cathode connected to the collector of IGBT element Q7, and has its anode connected to the emitter of IGBT element Q7. Diode D8 has its cathode connected to the collector of IGBT element Q8, and has its anode connected to the emitter of IGBT element Q8.

The phase arms have respective intermediate points connected to respective phase ends of respective phase coils of motor-generator MG2. That is, motor-generator MG2 is a three-phase permanent magnet synchronous motor, and three coils of U, V, W phases have respective one ends connected together to a neutral point. U-phase coil has its other end connected to a connection node of IGBT elements Q3, Q4. V-phase coil has its other end connected to a connection node of IGBT elements Q5, Q6. W-phase coil has its other end connected to a connection node of IGBT elements Q7, Q8.

Current sensor 24 detects the current passing through motor-generator MG2 as a motor current value MCRT2, and outputs motor current value MCRT2 to control apparatus 30.

Inverter 22 is connected to boost converter 12 in parallel with inverter 14. Inverter 22 converts the DC voltage output from boost converter 12 into three-phase AC and outputs the converted voltage to motor-generator MG1. Receiving the boosted voltage from boost converter 12, inverter 22 drives motor-generator MG1 to, for example, start the engine.

Inverter 22 also returns the power generated by motor-generator MG1 by rotation torque transmitted from the crankshaft of the engine to boost converter 12. Here, boost converter 12 is controlled by control apparatus 30 so as to operate as a step-down circuit.

While not shown in the drawing, the internal configuration of inverter 22 is the same as inverter 14, and detailed description thereof is not repeated.

Control apparatus 30 receives torque command values TR1, TR2, values of motor rotation speed MRN1, MRN2, voltage VB, VL, VH, and current IB, motor current values MCRT1, MCRT2 and an actuation signal IGON.

Here, torque command value TR1, motor rotation speed MRN1, and motor current value MCRT1 relate to motor-generator MG1, while torque command value TR2, motor rotation speed MRN2, and motor current value MCRT2 relate to motor-generator MG2.

Voltage VB is a voltage of battery B, while current IB is a current passing through battery B. Voltage VL is a voltage of boost converter 12 before boosted, while voltage VH is a voltage of boost converter 12 after boosted.

To boost converter 12, control apparatus 30 outputs a control signal PWU giving a boost instruction, a control signal PWD giving a step-down instruction, and a signal CSDN instructing prohibition of operation.

Furthermore, to inverter 14, control apparatus 30 outputs a drive instruction PWMI2 for converting DC voltage output from boost converter 12 into AC voltage for driving motor-generator MG2, and a regeneration instruction PWMC2 for converting AC voltage generated by motor-generator MG2 into DC voltage and returning the converted voltage to boost converter 12 side.

Similarly, to inverter 22, control apparatus 30 outputs a drive instruction PWMI1 for converting DC voltage into AC voltage for driving motor-generator MG1, and a regeneration instruction PWMC1 for converting AC voltage generated by motor-generator MG1 into DC voltage and returning the converted voltage to boost converter 12 side.

Figure 2:
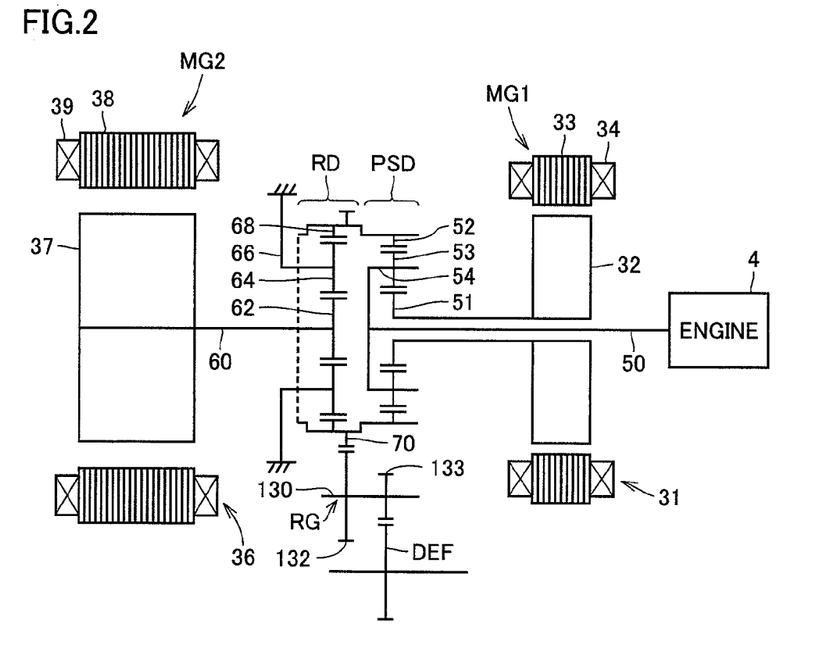
FIG. 2 is a schematic diagram for describing detail of a power split device and a reduction gear mechanism shown in FIG. 1.

FIG. 2 is a schematic diagram for describing detail of power split device PSD and reduction gear mechanism RD shown in FIG. 1.

Referring to FIG. 2, the vehicle drive apparatus includes motor-generator MG2, reduction gear mechanism RD connected to the rotation shaft of motor-generator MG2, an axle rotating according to the rotation of the rotation shaft reduced by reduction gear mechanism RD, engine 4, motor-generator MG1, and power split device PSD distributing motive power among reduction gear mechanism RD, engine 4, and motor-generator MG1. Reduction gear mechanism RD provides a gear reduction ratio of motor-generator MG2 to power split device PSD of at least 2:1, for example.

A crankshaft 50 of engine 4, a rotor 32 of motor-generator MG1 and a rotor 37 of motor-generator MG2 rotate around an identical axis.

Power split device PSD is a planetary gear in the example shown in FIG. 2. It includes a sun gear 51 coupled to a hollow sun gear shaft through the center of which crankshaft 50 passes, a ring gear 52 rotatably supported on the same axis as crankshaft 50, a pinion gear 53 arranged between sun gear 51 and ring gear 52 to revolve around the outer circumference of sun gear 51 while rotating on its own axis, and a planetary carrier 54 coupled to an end of crankshaft 50 to support rotation shaft of each pinion gear 53.

In power split device PSD, the three shafts, i.e., the sun gear shaft coupled to sun gear 51, a ring gear case coupled to ring gear 52, and crankshaft 50 coupled to planetary carrier 54, function as input/output shafts for motive power. When motive power to be input to or output from any two of the three shafts is determined, the motive power to be input to or output from the other one shaft is determined based on the motive power input to or output from the two shafts.

A counter drive gear 70 for extracting motive power is provided on the outside of the ring gear case, and rotates integrally with ring gear 52. Counter drive gear 70 is connected to a motive power transmission reduction gear RG. Between counter drive gear 70 and motive power transmission reduction gear RG, motive power is transmitted. Motive power transmission reduction gear RG drives a differential gear DEF. On a downhill or the like, rotation of the wheels is transmitted to differential gear DEF, and motive power transmission reduction gear RG is driven by differential gear DEF.

Motor-generator MG1 includes a stator 31 forming a rotating magnetic field, and a rotor 32 arranged inside stator 31 and having a plurality of permanent magnets embedded. Stator 31 includes a stator core 33, and a three-phase coil 34 wound around stator core 33. Rotor 32 is coupled to the sun gear shaft that integrally rotates with sun gear 51 of power split device PSD. Stator core 33 is formed by stacking thin electromagnetic steel plates, and fixed to a not-shown case.

Motor-generator MG1 operates as an electric motor that rotates rotor 32 by the interaction between the magnetic field formed by the permanent magnets embedded in rotor 32 and the magnetic field formed by three-phase coil 34. Motor-generator MG1 also operates as a generator generating electromotive force on opposing ends of three-phase coil 34 by the interaction between the magnetic field by the permanent magnets and the rotation of rotor 32.

Motor-generator MG2 includes a stator 36 forming a rotating magnetic field, and a rotor 37 arranged inside stator 31 and having a plurality of permanent magnets embedded. Stator 36 includes a stator core 38, and a three-phase coil 39 wound around stator core 38.

Rotor 37 is coupled by reduction gear mechanism RD to the ring gear case that integrally rotates with ring gear 52 of power split device PSD. Stator core 38 is formed by stacking thin electromagnetic steel plates, for example, and fixed to a not-shown case.

Motor-generator MG2 also operates as a generator generating electromotive force on opposing ends of three-phase coil 39 by the interaction between the magnetic field by the permanent magnets and the rotation of rotor 37. Motor-generator MG2 operates as an electric motor that rotates rotor 37 by the interaction between the magnetic field formed by the permanent magnets and the magnetic field formed by three-phase coil 39.

Reduction gear mechanism RD performs gear reduction by a structure in which planetary carrier 66, which is one of the rotation elements of the planetary gear, is fixed to the case of the drive apparatus for the vehicle. That is, reduction gear mechanism RD includes a sun gear 62 coupled to the shaft of rotor 37, a ring gear 68 integrally rotating with ring gear 52, and a pinion gear 64 meshing with ring gear 68 and sun gear 62 and transmitting the rotation of sun gear 62 to ring gear 68.

For example, by setting the number of teeth of ring gear 68 to be at least twice as great as the number of teeth of sun gear 62, the gear reduction ratio of at least 2:1 can be realized.

(Description of Arrangement of Components in Integrated Structure)

Next, arrangement of each component in the drive apparatus that integrally stores the inverter and the converter that drive the motor-generator will be described.

Figure 3:
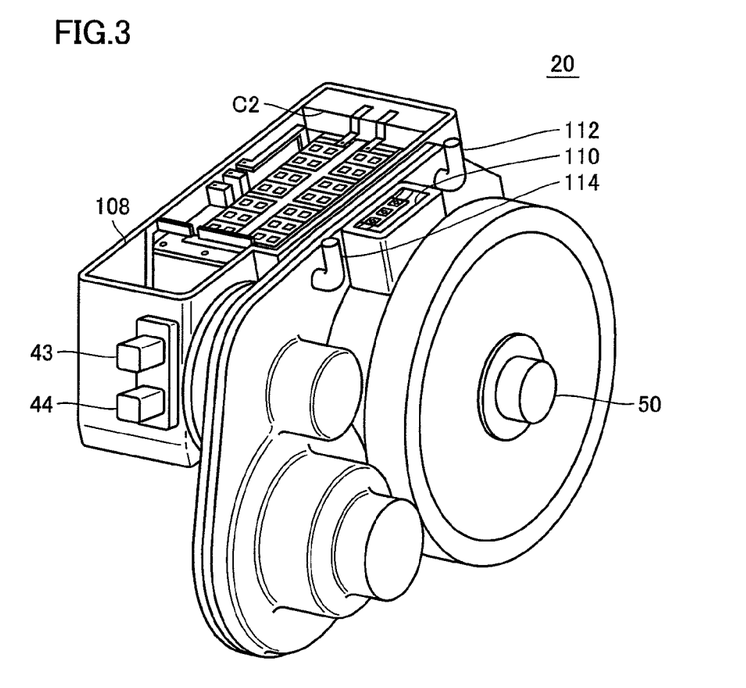
FIG. 3 is a perspective view showing the appearance of the drive apparatus for the hybrid vehicle according to an embodiment of the present invention.
Figure 4:
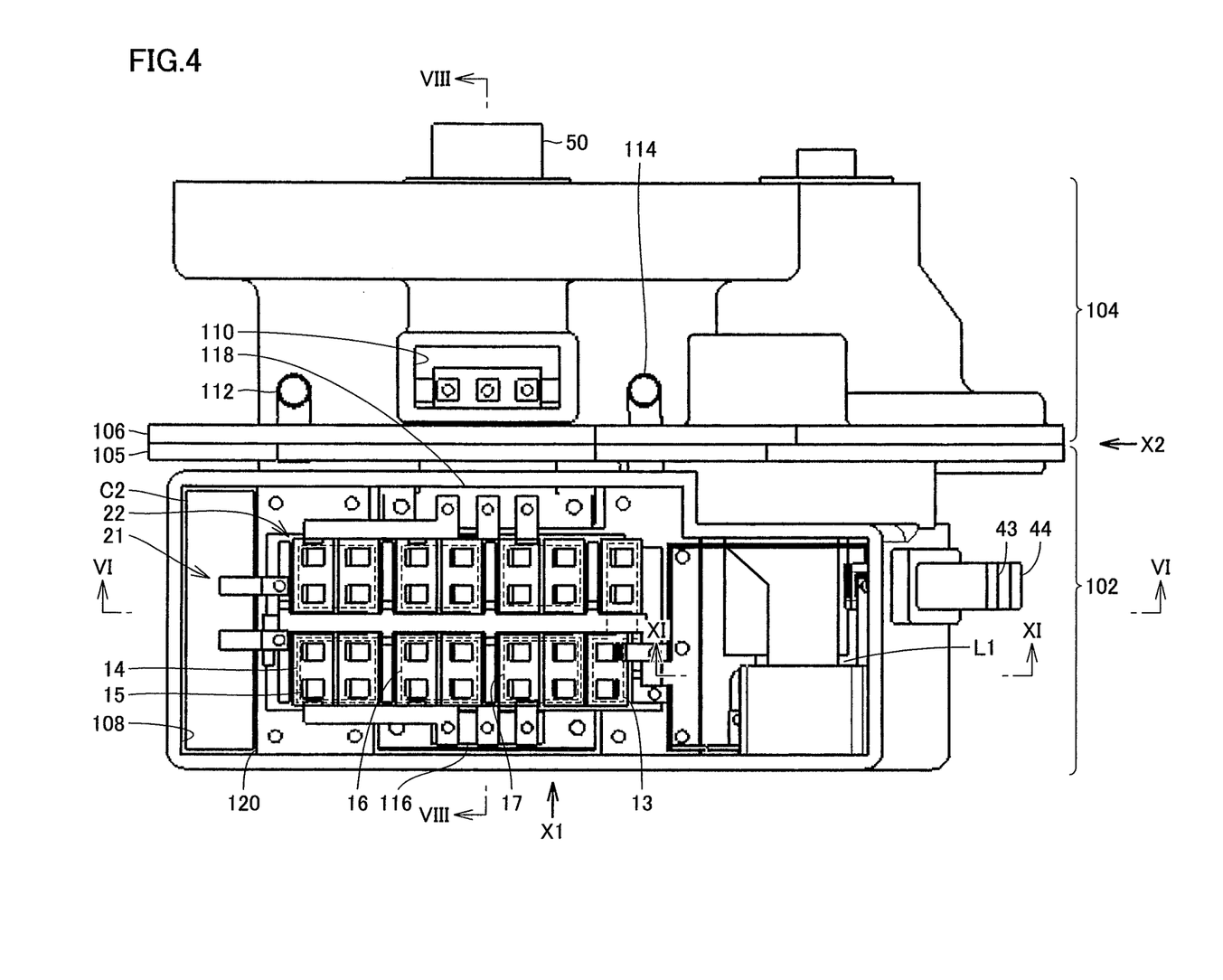
FIG. 4 is a plan view of the drive apparatus shown in FIG. 3.

FIG. 3 is a perspective view showing the appearance of drive apparatus 20 for a hybrid vehicle according to an embodiment of the present invention. FIG. 4 is a plan view of drive apparatus 20.

Referring to FIGS. 3 and 4, a case of drive apparatus 20 is configured so that it can be divided into a case 104 and a case 102. Case 104 is a portion that stores mainly motor-generator MG1 and case 102 is a portion that stores mainly motor-generator MG2 and the power control unit.

A flange 106 is formed at case 104, and a flange 105 is formed at case 102. Fixing of flange 106 and flange 105 by a bolt or the like integrates case 104 and case 102.

Case 102 is provided with an opening 108 for attaching the power control unit. Inside opening 108, capacitor C2 is stored in the left side portion (on the vehicle traveling direction side). A power element substrate 120 and terminal blocks 116, 118 are stored in the central portion. Reactor L1 is stored in the right side portion. Opening 108 is closed by a cover in a vehicle-installed state. The arrangement of capacitor C2 and reactor L1 may be switched so that capacitor C2 is arranged on the right side and reactor L1 is arranged on the left side.

That is, reactor L1 is arranged on one side of the rotation shafts of motor-generators MG1, MG2 and capacitor C2 is arranged on the other side of the rotation shafts. At a region between capacitor C2 and reactor L1, power element substrate 120 is arranged. Below power element substrate 120, motor-generator MG2 is arranged.

On power element substrate 120, inverter 22 controlling motor-generator MG1, inverter 14 controlling motor-generator MG2, and an arm portion 13 of the boost converter are mounted.

At a region between inverter 14 and inverter 22, power-supply bus bars arranged one above the other are provided. U-phase arm 15, V-phase arm 16, and W-phase arm 17 of inverter 14 are each provided with a bus bar extending therefrom toward terminal block 116 for connection with the stator coil of motor-generator MG2. Similarly, inverter 22 is provided with three bus bars extending therefrom toward terminal block 118 for connection with the stator coil of motor-generator MG1. Terminal blocks 118 and 116 on the stator coil side of motor-generator MG2 are connected with a power cable or a bus bar. While not shown, terminal blocks are also provided for the stator coil of motor-generator MG1.

Since the temperature of power element substrate 120 becomes high, a water passage is provided below power element substrate 120 to cool the same. A cooling water inlet 114 and a cooling water outlet 112 of the water passage are provided to case 102. It is to be noted that the inlet and outlet are formed by, for example, driving in a union nut or the like to case 102, penetrating through flanges 106, 105.

The voltage supplied from battery unit 40 shown in FIG. 1 to terminals 43, 44 via power cables are boosted by boost converter 12 including reactor L1 and arm portion 13, smoothed by capacitor C2, and supplied to inverters 14, 22.

Thus, by boosting the battery voltage using boost converter 12 and using the boosted voltage, it becomes possible to reduce the battery voltage to about 200V while driving the motor-generators at a high voltage exceeding 500V. By supplying power with small current, electric loss is suppressed and high output of the motors can be realized.

When boost converter 12 is also integrated as drive apparatus 20 in addition to inverters 14, 22 and motor-generators MG1, MG2, where to arrange reactor L1 and capacitor C2, which are relatively large components, becomes a concern.

Figure 5:
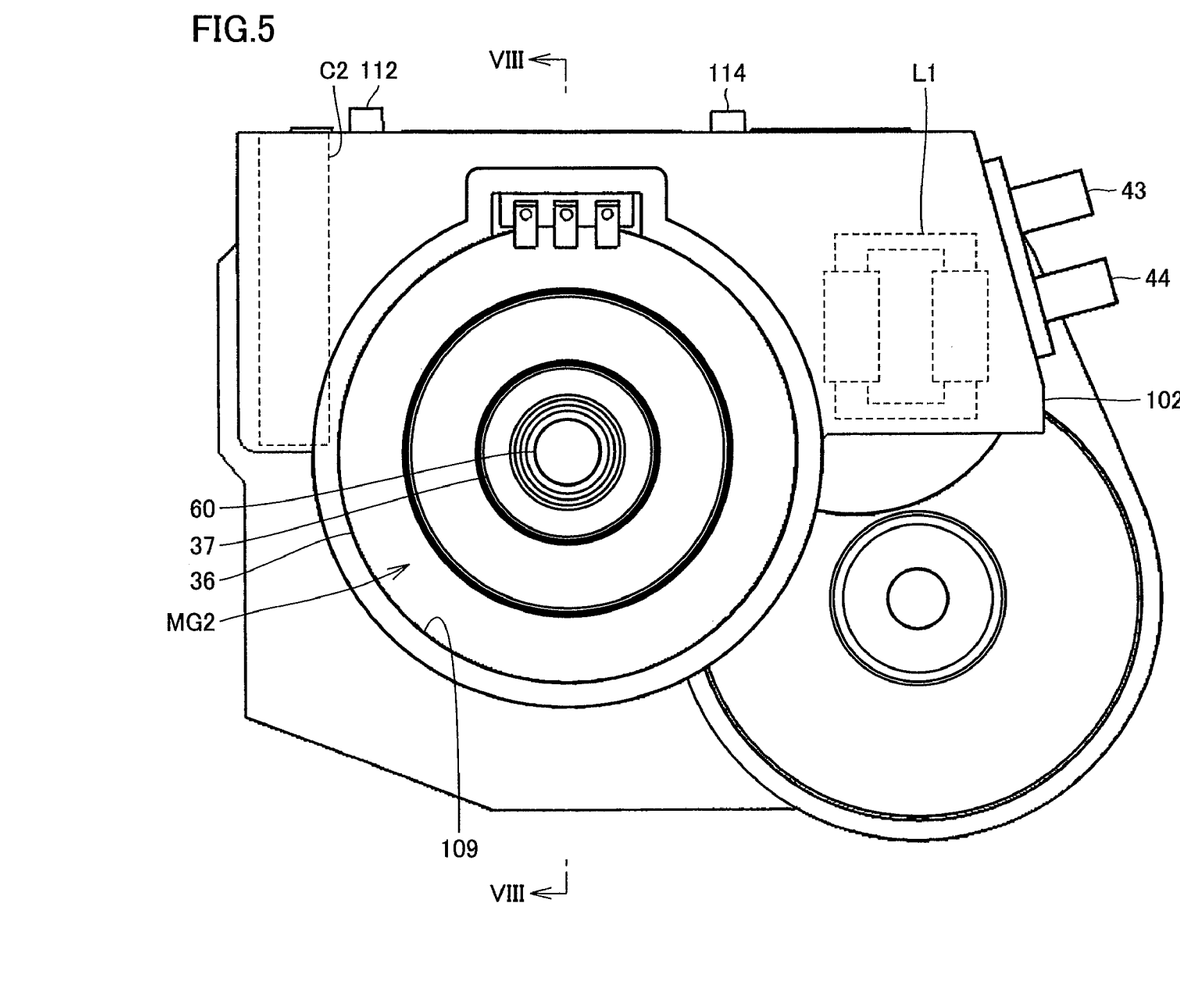
FIG. 5 is a side view of the drive apparatus as seen from X1 direction of FIG. 4.

FIG. 5 is a side view of drive apparatus 20 as seen from X1 direction of FIG. 4.

Referring to FIG. 5, case 102 is provided with an opening 109 for attaching the motor-generator and for maintenance. Opening 109 is closed by a cover in a vehicle-installed state.

Inside opening 109, motor-generator MG2 is arranged. Inside stator 36 to which the U-, V- and W-phase bus bars are connected, rotor 37 is arranged. At the center portion of rotor 37, a hollow shaft 60 is seen.

As shown in FIG. 5, stator 36 of motor-generator MG2 greatly wedges into the storage chamber of case 102 where power control unit 21 is stored. Accordingly, reactor L1 is arranged on one side of motor-generator MG2 while capacitor C2 is arranged on the other side. Thus, the large components are efficiently stored. As a result, a compact drive apparatus for a hybrid vehicle is implemented.

Figure 6:
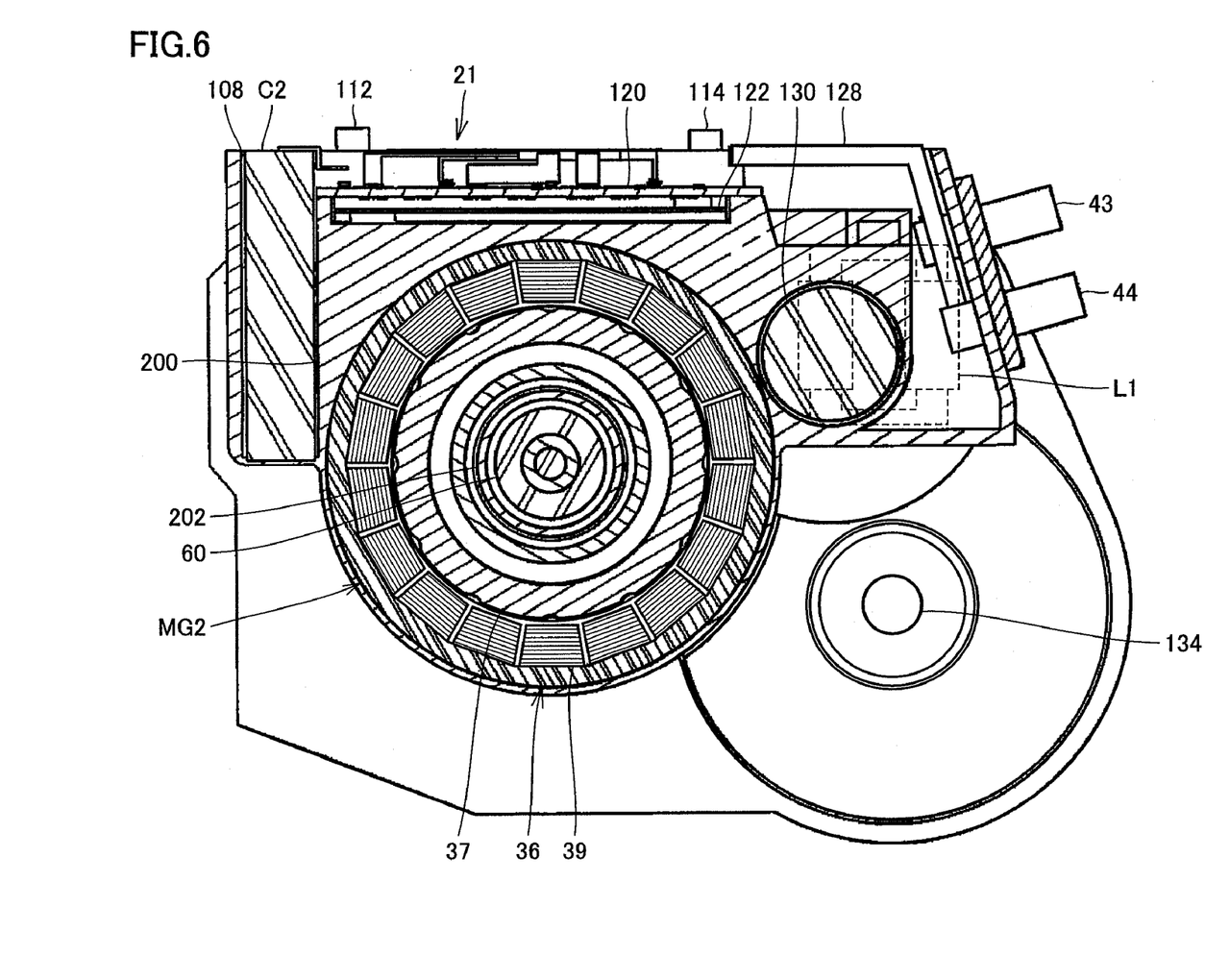
FIG. 6 is a cross-sectional view of VI-VI cross section in FIG. 4.

FIG. 6 is a cross-sectional view of VI-VI cross section in FIG. 4.

Referring to FIG. 6, the cross section of motor-generator MG2 and the cross section of the portion storing power control unit 21 are shown.

The drive apparatus for the hybrid vehicle includes: motor-generators MG2 and MG1 having rotation center axes of respective rotors coaxially arranged, motor-generator MG1 being arranged behind motor-generator MG2; a power split device arranged coaxially with the rotation center axis of the crankshaft, between motor-generator MG1 and motor-generator MG2; and a power control unit 21 controlling motor-generators MG1, MG2. In power control unit 21, reactor L1 and smoothing capacitor C2 are arranged as divided relative to the rotation center axis of motor-generator MG2, so that reactor L1 is on at least one side and smoothing capacitor C2 is on the other side. Motor-generators MG1, MG2, the power split device and power control unit 21 are integrated as being stored in a metal case.

Case 102 is provided with a dividing wall 200 separating two spaces, so that lubricant oil of motor-generator MG2 does not leak to power element substrate 120 side. The top surface portion of dividing wall 200 is provided with a water passage 122 for cooling power element substrate 120. Water passage 122 communicates with cooling water inlet 114 and cooling water outlet 112 described above.

From terminal 44, power supply potential on minus side is transmitted to power element substrate 120 by bus bar 128. From terminal 43, positive power supply potential is transmitted to reactor L1 by another not-shown bus bar.

Into the storage chamber storing the power control unit, a portion supporting rotation shaft 130 of the reduction gear is wedged.

The cross section of motor-generator MG2 is described. The winding portion of coil 39 of stator 36 is seen on the inner circumference side of the stator. On further inner circumference, rotor 37, dividing wall 202 of the case and a hollow shaft 60 of the rotor are seen.

That is, the drive apparatus of the vehicle includes motor-generator MG2, power control unit 21 controlling motor-generator MG2, and the case storing motor-generator MG2 and power control unit 21. Power control unit 21 includes a first inverter driving motor-generator MG2, and a voltage converter configured to include reactor L1 to boost the supply voltage and provide the boosted voltage to the first inverter.

Figure 7:
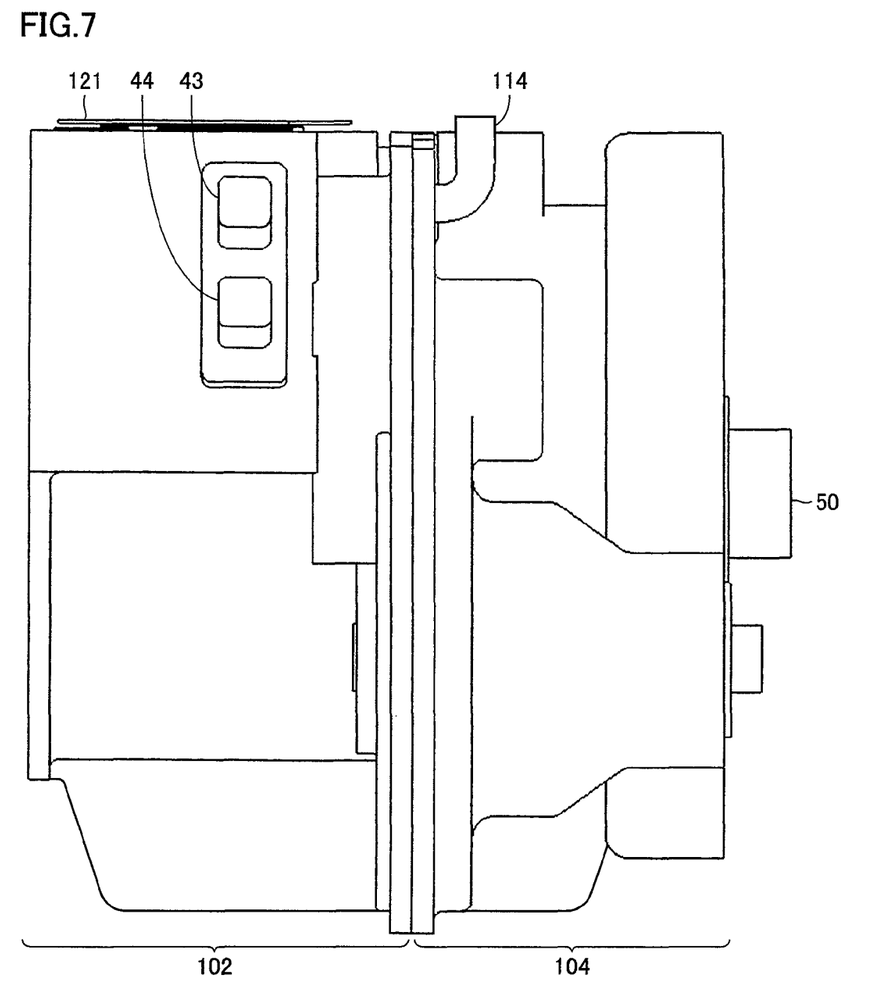
FIG. 7 is a side view of the drive apparatus as seen from X2 direction of FIG. 4.

FIG. 7 is a side view of drive apparatus 20 as seen from X2 direction of FIG. 4. In FIG. 7, a control substrate 121 controlling a power element is arranged at an upper portion of the power element substrate.

Figure 8:
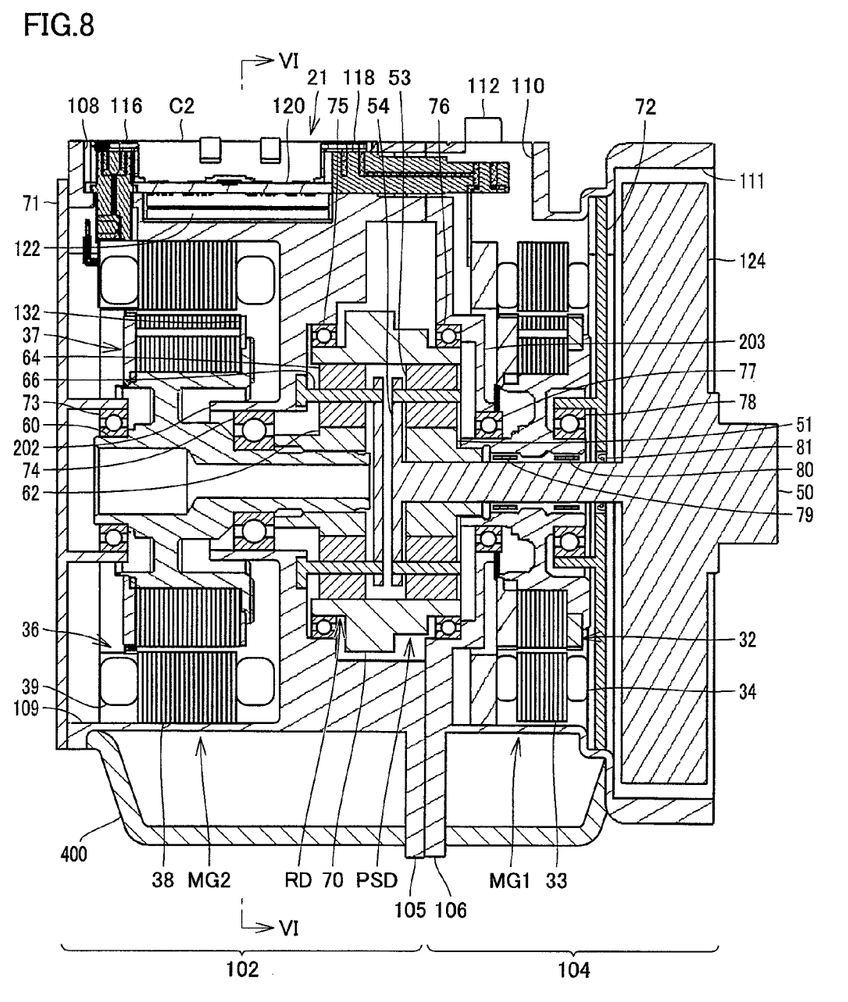
FIG. 8 is a cross sectional view along VIII-VIII in FIG. 4.

FIG. 8 is a cross sectional view along VIII-VIII in FIG. 4. Referring to FIGS. 7 and 8, crankshaft 50 of the engine is connected to a damper 124. Damper 124 has its output shaft connected to power split device PSD.

From the side where the engine is arranged, damper 124, motor-generator MG1, power split device PSD, reduction gear mechanism RD, and motor-generator MG2 are arranged on the identical rotation axis in this order. The shaft of rotor 32 of motor-generator MG1 is hollow, through which the output shaft of damper 124 passes.

The shaft of rotor 32 of motor-generator MG1 is spline-fit with sun gear 51 on power split device PSD side. The shaft of damper 124 is coupled with planetary carrier 54. Planetary carrier 54 rotatably supports the rotation shaft of pinion gear 53 around the shaft of damper 124. Pinion gear 53 meshes with sun gear 51 and ring gear 52 shown in FIG. 2 formed at the inner circumference of the ring gear case.

The reduction gear mechanism RD side of rotor shaft 60 of motor-generator MG2 is spline-fit with sun gear 62. Planetary carrier 66 of reduction gear mechanism RD is fixed to dividing wall 202 of case 102. Planetary carrier 66 supports the rotation shaft of pinion gear 64. Pinion gear 64 meshes with sun gear 62 and ring gear 68 shown in FIG. 2 formed at the inner circumference of the ring gear case.

As can be seen from FIG. 8, motor-generator MG1 and damper 124 can be attached from opening 111, which is on the right side in the drawing, of case 104. Motor-generator MG2 can be attached from opening 109, on the left side, of case 102. Reduction gear mechanism RD and power split device PSD can be attached from the mating interface between flanges 105, 106.

Below the stators of motor-generators MG1, MG2, an oil pan 400 is provided. The lubricant oil stored in the oil pan is carried up by the rotation of motor-generators MG1, MG2, or by a group of gears that rotate according thereto, and supplied to respective portions. The lubricant oil is circulated in a space enclosed by case 102. The lubricant oil also has a function of a heat transfer medium that transfers heat among respective portions. More specifically, it has a function as a refrigerant. That is, the lubricant oil corresponds to the "heat transfer medium" in the present embodiment.

Opening 109 of case 102 is sealed by a cover 71 and a liquid gasket or the like, so that the lubricant oil does not leak. A cover 72 is provided at the depth of opening 111 of case 104, and the space storing MG1 is sealed by liquid gasket or the like and an oil seal 81 so that the lubricant oil does not leak.

The shaft of rotor 32 of motor-generator MG1 is rotatably supported by a ball bearing 78 provided between the shaft and cover 72 and a ball bearing 77 provided between the shaft and dividing wall 203. The shaft of rotor 32 is hollow, through which the shaft of damper 124 passes. Between the shaft of rotor 32 and the shaft of damper 124, needle bearings 79, 80 are provided.

The shaft of rotor 37 of motor-generator MG2 is rotatably supported by a ball bearing 73 provided between the shaft and cover 71 and a ball bearing 74 provided between the shaft and dividing wall 202.

The ring gear case having both the ring gear of reduction gear mechanism RD and the ring gear of power split device PSD engraved at the inner circumference is rotatably supported by a ball bearing 75 provided between the ring gear case and dividing wall 202 and a ball bearing 76 provided between the ring gear case and dividing wall 203.

Though the storage chamber storing power control unit 21 and the storage chamber storing motor-generator MG2 are separated by dividing wall 202 of case 102, they are partially connected by a though hole into which terminal block 116 is inserted. To one side of terminal block 116, the bus bar of the stator coil of motor-generator MG2 is connected. To the other side, the bus bar of inverter 14 is connected. A conductive member passes through the inside of terminal block 116 so that these bus bars can electrically be connected. That is, terminal block 116 is configured so as not to pass the lubricant oil from motor-generator MG2 side and to pass electricity.

Similarly, by terminal block 118, the space where the power control unit is stored and the space where motor-generator MG1 is stored are connected in the state where electricity is passed and the lubricant oil is not passed.

Figure 9:
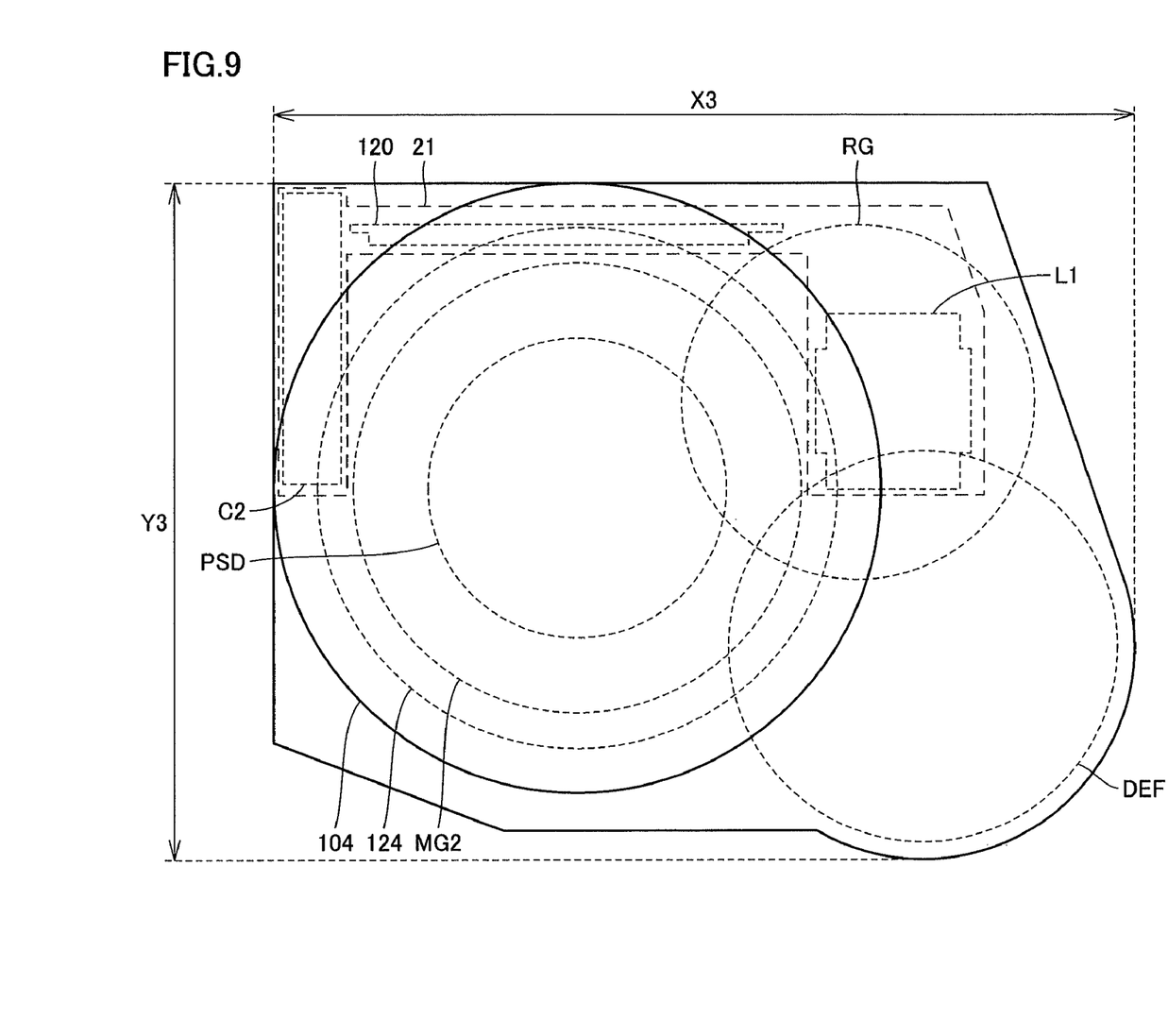
FIG. 9 shows the contour of a case and components stored therein, as the case is projected from the rotation shaft direction.

FIG. 9 shows the contour of the case and components stored therein, as the case is projected from the rotation shaft direction.

In FIG. 9, shown inside the case of the drive apparatus for the vehicle are: damper 124 to which the crankshaft of the internal combustion engine is connected; motor-generator MG2 having a rotor being arranged so that its rotation shaft overlaps with the rotation shaft of damper 124 and a stator arranged around the rotor; power split device PSD receiving torque from damper 124 and torque from motor-generator MG2; reduction gear RG having a rotation shaft being displaced from the rotation shaft of damper 124 substantially in parallel therewith, and to which torque from power split device PSD is transmitted; differential gear DEF having a rotation shaft being displaced from the rotation shaft of damper 124 substantially in parallel therewith, and meshing with reduction gear RG to transmit torque to the wheels; and power control unit 21 including substrate 120 controlling motor-generator MG2, reactor L1 and capacitor 2. The case stores damper 124, motor-generator MG2, reduction gear RG, differential gear DEF and power control unit 21.

In the projection of FIG. 9 where the case is projected from the rotation shaft direction, the dimension in the horizontal direction when the drive apparatus for the vehicle is installed in the vehicle is X3. Opposing ends of dimension X3 are defined by the outer edge of the case portion storing differential gear DEF and the outer edge of case 104 storing damper 124. Accordingly, it can be understood that capacitor C2, substrate 120 and reactor L1 constituting the power control unit are inside dimension X3.

In FIG. 9, the dimension in the vertical direction (height direction) when the drive apparatus for the vehicle is installed on the vehicle is Y3. The lower end of dimension Y3 is defined by the outer edge of the portion of the case where differential gear DEF is stored. The upper end of dimension Y3 is defined by the outer edge of the portion of the case where damper 124 is stored. Accordingly, it can be understood that capacitor C2, substrate 120 and reactor L1 constituting the power control unit are arranged inside dimension Y3.

The case is configured and power control unit 21 is arranged, such that, when the case is projected from the rotation shaft direction, the height, in a vehicle-installed state, of the projected portion of the portion of the case where power control unit 21 is stored does not at least exceed the height, in a vehicle-installed state, of the projected portion of the remaining space of the case, i.e., the portion where damper 124, motor-generator MG2, reduction gear RG and differential gear DEF are stored. Thus, the center of gravity of the vehicle can be lowered and the running stability can be improved.

In the horizontal direction in a vehicle-installed state, the case is configured and power control unit 21 is arranged so that the position of the projected portion of the portion of the case where power control unit 21 is stored is positioned inside the projected portion of the remaining space of the case. Thus, the volume of the drive apparatus for the vehicle is reduced.

Figure 10:
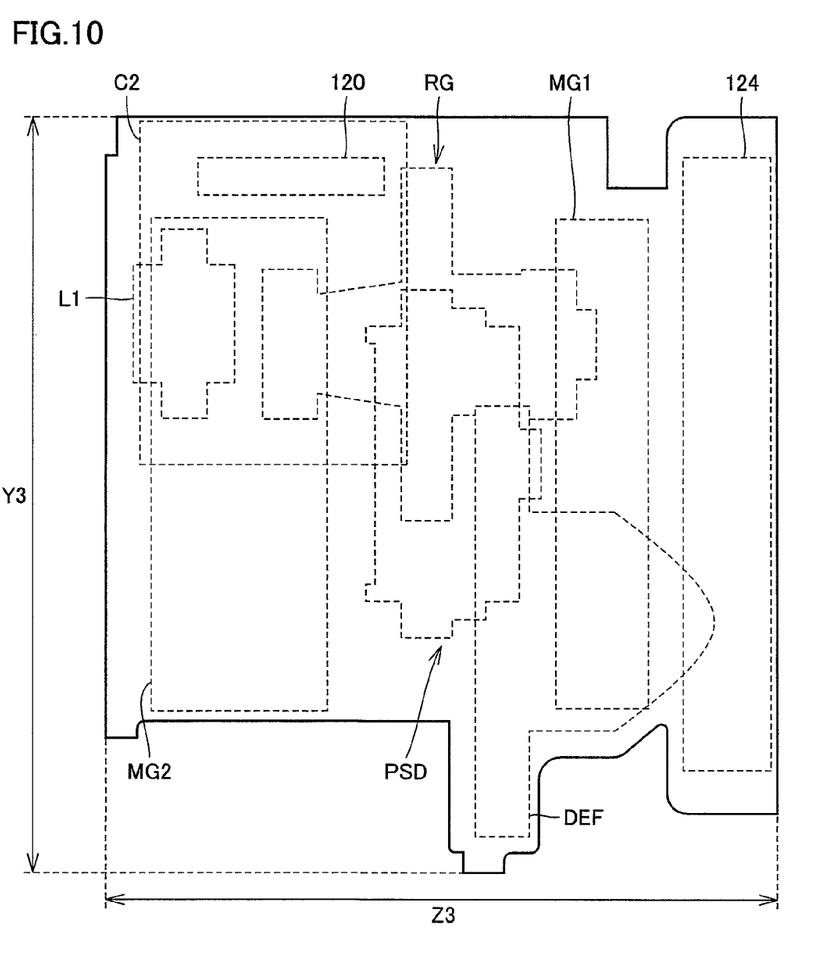
FIG. 10 shows the contour of the case and the components stored therein, as the case is projected from the direction that is perpendicular to the rotation shaft direction and also perpendicular to the vertical direction.

FIG. 10 shows the contour of the case and the components stored therein, as the case is projected from the direction that is perpendicular to the rotation shaft direction and also perpendicular to the vertical direction.

Referring to FIG. 10, dimension X3 in the direction perpendicular to the vertical direction in a vehicle-installed state also has its opposing ends defined by the outer edge of the cover of the portion of the case where motor-generator MG2 is stored and the outer edge of the portion of the case where damper 124 is stored. It can be understood that capacitor C2, substrate 120 and reactor L1 constituting the power control unit are inside dimension Z3.

That is, as described referring to FIG. 9, dimension Y3 of the vertical direction (height direction) is defined by the portion storing damper 124, motor-generator MG2, reduction gear RG and differential gear DEF. The portion storing power control unit 21 including substrate 120, reactor L1 and capacitor C2 in FIG. 10 is provided such that, when projected from the direction perpendicular to the rotation shaft direction and perpendicular to the vertical direction in a vehicle-installed state, the projected portion thereof is included in the projected portion of the remaining space of the case, that is, the portion storing damper 124, motor-generator MG2, reduction gear RG and differential gear DEF.

Thus, in the state where reduction gear RG and differential gear DEF are arranged in addition to motor-generators MG1, MG2, reduction gear mechanism RD and power split device PSD, power element substrate 120, reactor L1 and capacitor C2 being the components of the power control unit are arranged, utilizing the surrounding free space. As a result, the drive apparatus for the vehicle having the suppressed height and being compact can be implemented.

Particularly, as shown in FIG. 9, instead of utilizing only one free space on one side relative to motor-generator MG2, by arranging reactor L1 and capacitor C2 in both the free spaces, respectively, weight is balanced relative to motor-generator MG2 and further reduction in the space can be attained.

It is to be noted that power split device PSD, reduction gear RG to which torque from power split device PSD is transmitted and differential gear DEF meshing with reduction gear RG and transmitting torque to the wheels correspond to, as a whole, a "powertrain" that combines the motive power generated by the engine and the motive power generated by motor-generators MG1, MG2 and transmits the combined motive power to the driveshaft. Reduction gear RG and differential gear DEF each correspond to a motive power transmitting gear to which torque from power split device PSD is transmitted. However, reduction gear RG and differential gear DEF are not essential, and the present invention is also applicable to a vehicle having a configuration without reduction gear RG or a configuration of rear-wheel drive in which differential gear DEF is not integrated with the drive apparatus.

Furthermore, the present invention is also applicable to a parallel-hybrid type in which acceleration of the engine and the like is assisted by the motor, and to a configuration where only one motor for the drive apparatus is integrated.

(Configuration of Supplying Refrigerant to Reactor Core)

Next, a configuration of supplying refrigerant to a reactor core in the drive apparatus in the present embodiment will be described.

Figure 11:
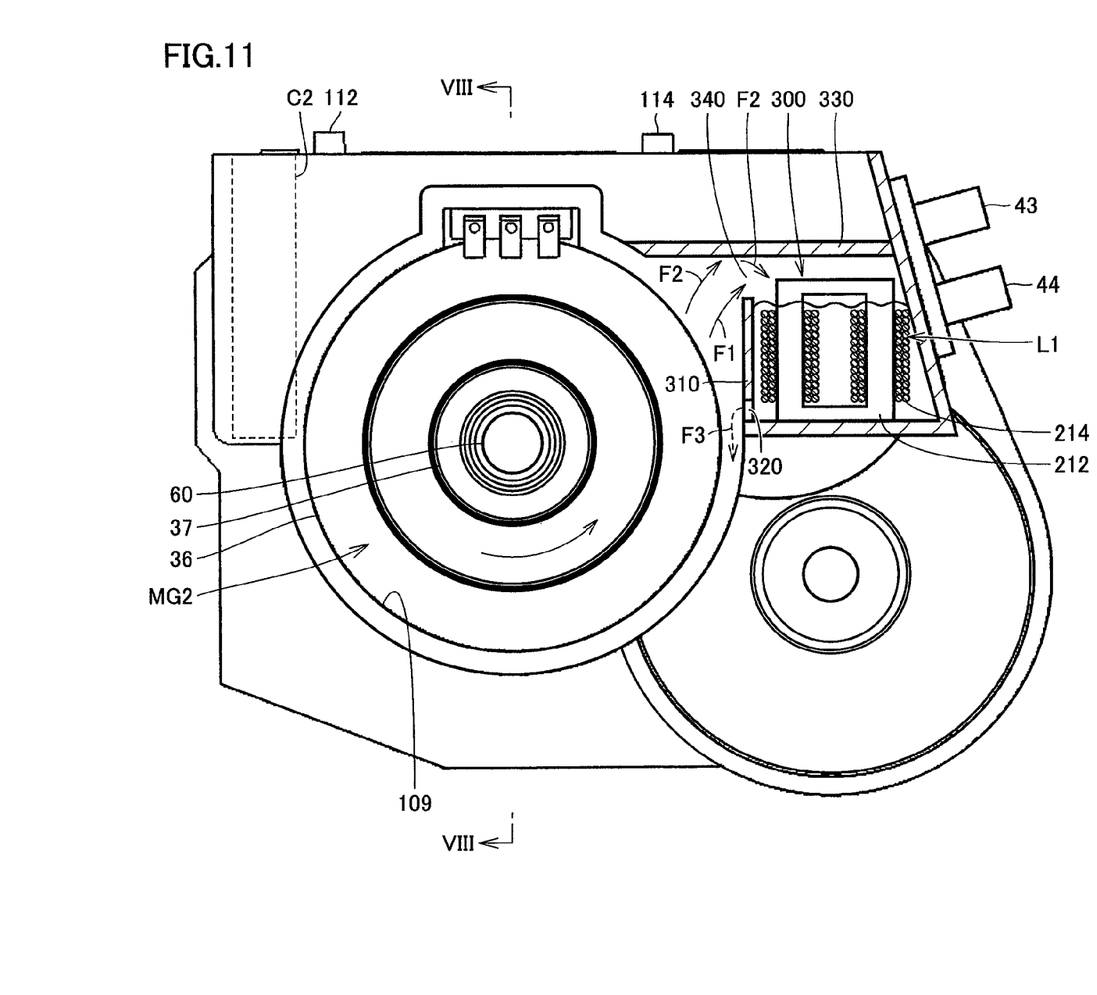
FIG. 11 is a partial cross-sectional view along XI-XI in FIG. 4 for describing a configuration for cooling the reactor.

FIG. 11 is a partial cross-sectional view along XI-XI in FIG. 4 for describing a configuration for cooling the reactor. FIG. 11 shows the cross section of reactor L1 and storage chamber 300 therefor in the storing portion that stores power control unit 21.

Referring to FIG. 11, storage chamber 300 for reactor L1 is provided by the space communicating with the portion of case 102 where motor-generator MG2 is stored. Storage chamber 300 has a dividing wall 310 between the portion storing motor-generator MG2. Dividing wall 310 is provided such that opening 340 is established between a ceiling portion 330 and dividing wall 310 of storage chamber 300.

The lubricant oil carried up by the rotation of motor-generator MG2 flows into storage chamber 300 from opening 340 as indicated by arrow F1, or via ceiling portion 330 as indicated by arrow F2. By providing dividing wall 310, the lubricant oil flown into storage chamber 300 is stored therein. Therefore, at least part of reactor L1 is immersed in the lubricant oil.

Thus, by supplying the lubricant oil of the motor-generator system as refrigerant to reactor L1 according to the rotation of motor-generator MG2, a configuration of cooling reactor L1 can be implemented without providing a new refrigerant supplying mechanism. When the lubricant oil used as the refrigerant is circulated in the space enclosed by case 102, it also makes contact and exchanges heat with case 102 having great heat capacity at least at a portion of the circulation route. Therefore, an increase in the temperature of the refrigerant is suppressed, whereby the capacity of cooling the reactor can be ensured.

In particular, when compared with a configuration where dividing wall 310 is not provided and the lubricant oil carried up by the rotation of motor-generator MG2 is just flown over reactor L1, reactor L1 can evenly be cooled and therefore the capacity of cooling the same can be improved.

Furthermore, by providing an oil-drain hole 320 to dividing wall 310, as indicated by arrow F3, the lubricant oil in storage chamber 300 can be discharged toward motor-generator MG2 side (oil pan 400: FIG. 8). Thus, the lubricant oil in storage chamber 300 is provided with fluidity. The lubricant oil making contact with reactor L1 is continuously replaced and an increase in the temperature thereof is suppressed. Accordingly, the capacity of cooling the reactor can further be improved. It is to be noted that, by designing the diameter of oil-drain hole 320 to so that the hole functions as an orifice regulating the flow rate, the state where reactor L1 is immersed in the lubricant oil in storage chamber 300 can be maintained.

It is also possible to design the height of dividing wall 310 so that coil 214 is at the level where it can be immersed in the lubricant oil while part (upper part) of core 212 is not in the immersed state, in order to suppress an increase in size of storage chamber 300 in the height direction to thereby ensure opening 340 for introducing the lubricant oil. In this case, by designing reactor L1 so that heat generated by coil 214 becomes greater than heat generated by core 212 by the design of the material and cross sectional area of the core and the material (unit length resistance) and number of turns of the coil, the capacity of cooling reactor L1 can be ensured.

Since it is configured such that the lubricant oil carried up by the rotation of motor-generator MG2 is directly introduced into storage chamber 300 from opening 340, the size of storage chamber 300 in the height direction can be reduced as compared with a configuration where a watershoot-like mechanism receiving and collecting the carried up lubricant oil is provided. As a result, the arrangement of reactor L1 becomes more efficient.

As described above, according to the embodiment of the present invention, the drive apparatus integrally storing the motor-generator, and the inverter and the boost converter for driving the motor-generator is realized. Additionally, in the integrated structure, the heat dissipation performance of the reactor core efficiently arranged in the limited space can be improved. Furthermore, by configuring the cooling system such that the refrigerant (heat transfer medium) making contact with reactor L1 also makes contact with the case having large heat capacity for the integrated storage, an increase in the temperature of the reactor can be suppressed to avoid reduction in the efficiency of the boost converter.

It should be understood that the embodiment disclosed herein is illustrative and non-restrictive in every respect. The scope of the present invention is defined by the terms of the claims, rather than the description above, and is intended to include any changes within the meaning and scope equivalent to the terms of the claims.

INDUSTRIAL APPLICABILITY

The drive apparatus for the vehicle according to the present invention is applicable to an electric powered vehicle such as a hybrid vehicle having a motor as a source of drive force of the vehicle.

The invention claimed is:

1. A drive apparatus for a vehicle, comprising:
a rotating electric machine;
a power control unit controlling said rotating electric machine; and
a case storing said rotating electric machine and said power control unit,
said power control unit including
an inverter driving said rotating electric machine, and
a voltage converter configured to include a reactor, for boosting a supply voltage and providing the boosted voltage to said inverter,
said case including a storage chamber storing said reactor, and
said storage chamber being provided in a shape such that a heat transfer medium carried up by rotation of said rotating electric machine flows into said storage chamber from an opening and at least part of said reactor is immersed in the heat transfer medium flown into said storage chamber.

2. The drive apparatus for the vehicle according to claim 1, wherein
said storage chamber is provided with a hole discharging said heat transfer medium toward said rotating electric machine.

3. The drive apparatus for the vehicle according to claim 1, wherein
said reactor includes
a core and
a coil wound around said core, wherein
said storage chamber is provided in a shape such that said coil substantially in its entirety and part of said core are immersed in the heat transfer medium flown into said storage chamber, and wherein
said reactor is designed such that heat generated by said coil becomes greater than heat generated by said core.

4. The drive apparatus for the vehicle according to claim 1, wherein
said heat transfer medium is lubricant oil that lubricates and cools said rotating electric machine, and
said lubricant oil is circulated in a space enclosed by said case, and makes contact with said case at least at part of a route along which said lubricant oil is circulated.

5. The drive apparatus for the vehicle according to claim 2, wherein
said heat transfer medium is lubricant oil that lubricates and cools said rotating electric machine, and
said lubricant oil is circulated in a space enclosed by said case, and makes contact with said case at least at part of a route along which said lubricant oil is circulated.

6. The drive apparatus for the vehicle according to claim 3, wherein
said heat transfer medium is lubricant oil that lubricates and cools said rotating electric machine, and
said lubricant oil is circulated in a space enclosed by said case, and makes contact with said case at least at part of a route along which said lubricant oil is circulated.

* * * * *